United States Patent [19]
Dobrovolny

[11] Patent Number: 5,270,824
[45] Date of Patent: Dec. 14, 1993

[54] AGC CIRCUIT FOR DOUBLE CONVERSION DIGITAL TELEVISION TUNER

[75] Inventor: Pierre Dobrovolny, North Riverside, Ill.

[73] Assignee: Zenith Electronics Corporation, Glenview, Ill.

[21] Appl. No.: 815,711

[22] Filed: Dec. 30, 1991

[51] Int. Cl.$^5$ ............................................. H04N 5/50
[52] U.S. Cl. .................. 358/191.1; 455/248.1; 330/284; 333/109
[58] Field of Search ............... 358/191.1, 195.1; 455/200.1, 234.1, 248.1, 249.1; 330/284, 145; 333/109, 116; 331/81 R, 81 A

[56] References Cited

U.S. PATENT DOCUMENTS

| | | | |
|---|---|---|---|
| 4,216,445 | 8/1980 | Abajian | 333/109 |
| 4,559,489 | 12/1985 | Vacanti et al. | 333/81 A |
| 4,590,613 | 5/1986 | Tannery | 455/200.1 |
| 4,673,886 | 6/1987 | Bickley et al. | 330/284 |

FOREIGN PATENT DOCUMENTS 0464792 8/1992 European Pat. Off. .

*Primary Examiner*—James J. Groody
*Assistant Examiner*—Glenton B. Burgess

[57] ABSTRACT

An AGC system for a double conversion type tuner for tuning digital television signals includes a quadrature coupler that has two of its four ports each terminated by a pin diode. The pin diodes are driven conductive in response to an AGC voltage and control the power transfer from the first mixer to the first IF amplifier. A series resistor is connected in circuit with each pin diode for providing a 50 ohm impedance when its associated pin diode is driven fully conductive. The pin diodes are conductively balanced to maintain impedance matching between the first mixer and the first IF amplifier.

8 Claims, 1 Drawing Sheet

| G1 | G2 | PA | P1 | P2 | P3 |
|---|---|---|---|---|---|
| 0 | 0 | 1 | 0 | 0 | 1 |
| 1 | 1 | 1 | 1/2 | 1/2 | 0 |
| .172 | .172 | 1 | 1/4 | 1/4 | 1/2 |
| .072 | .072 | 1 | 1/8 | 1/8 | 3/4 |

AGC CIRCUIT FOR DOUBLE CONVERSION DIGITAL TELEVISION TUNER

CROSS REFERENCE TO RELATED APPLICATIONS

This application is related to, but not dependent upon, application Ser. No. 815,721, filed Dec. 30, 1991, entitled A BANDSWITCHED TUNING SYSTEM FOR DIGITAL TELEVISION RECEIVERS, in the name of the inventor and assigned to Zenith Electronics Corporation.

BACKGROUND OF THE INVENTION AND PRIOR ART

This invention relates generally to television tuning systems and particularly to television tuning systems for tuning digital television signals. More specifically it relates to double conversion type television tuning systems for use with digital television signals.

There has been recent emphasis on developing digital transmission techniques for a new high definition television system for the United States. A major shortcoming of the digital signal format is the lack of redundancy in the transmitted data, requiring that the data be very accurately detected. In analog television signals, many types of distortion and noise can be tolerated because the signal data or information is redundant and errors can, to a large extent, be integrated out. Digital data, however, has no redundancy and failure to properly detect and decode the digital data results in the information represented by that data being lost. It is therefore very important that digital signal processing utilizes suitable components prior to detection of the digital data, to assure that the RF signal carrying the digital data is not corrupted in any way.

It is also important to assure that the tuning system is not subjected to signal overloads. In conventional analog tuning systems, an automatic gain control (AGC) circuit is used as a means to reduce the tuner signal amplitude to prevent signal overload. These AGC circuits do not, by and large, meet the needs of the digital environment. For example: the minimum attenuation level should be a small fraction of 1 dB; the input and output impedances of the AGC circuit should remain well-matched with the source and load impedances at all AGC levels; the AGC range should be sufficiently large (greater than 40 dB) for very high frequencies of one gigahertz and greater; the AGC circuit should not cause any greater distortion than the other parts of the tuning system; the tuner in-band frequency response should be independent of AGC level; and the AGC regulation characteristic should be nearly linear or at least not have abrupt changes.

With the present invention, an improved AGC circuit is provided that enables control of the RF signal level applied to the IF amplifier while meeting the above-mentioned requirements.

OBJECTS OF THE INVENTION

A principal object of the invention is to provide an improved digital television signal tuning system.

Another object of the invention is to provide a digital television tuning system having excellent performance characteristics.

A further object of the invention is to provide a novel AGC system for a digital television tuner.

BRIEF DESCRIPTION OF THE DRAWINGS

These and other objects and advantages of the invention will be apparent upon reading the following description in conjunction with the drawings in which.

DESCRIPTION OF THE PREFERRED EMBODIMENT

Figures 1, 2:
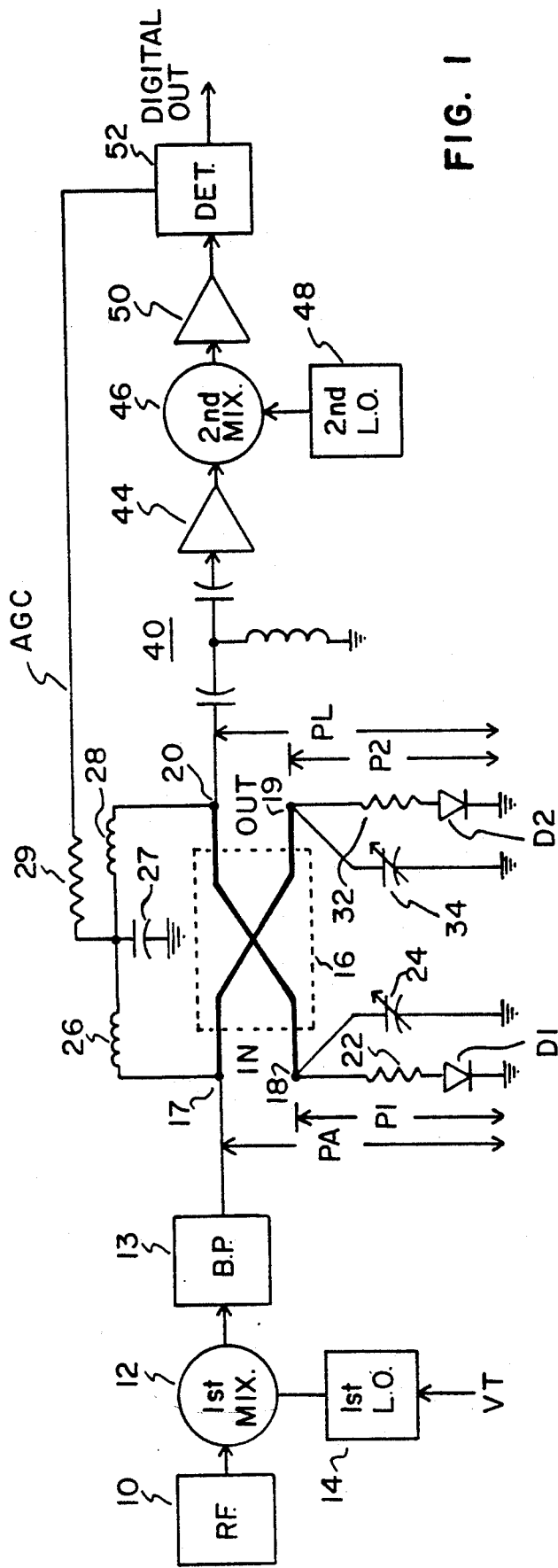
FIG. 1 is a partial schematic diagram of a digital tuner constructed in accordance with the invention.
FIG. 2 is a table indicating the action of the AGC circuit of FIG. 1 in controlling signal power to the IF amplifier.

In FIG. 1, a double conversion television tuning system is generally disclosed. While the preferred embodiment of the invention is in conjunction with a double conversion tuning system, it will be apparent to those skilled in the art that the principles thereof are equally applicable to single conversion television tuning systems. An RF amplifier 10 amplifies received transmitted digital television signals and applies them to a first mixer 12. Mixer 12 is also supplied with a local oscillator (LO) signal from a first local oscillator 14. A tuning voltage VT controls the frequency of the signal provided by the first local oscillator 14 for mixing with the RF signals in first mixer 12. The output of first mixer 12 comprises a first IF frequency which is supplied through a bandpass filter 13 to an input port 17 of a quadrature coupler 16, which is indicated by dashed lines. The quadrature coupler 16 has another input port 18 and a pair of output ports 19 and 20. The coupler 16 preferably comprises a metal tube (not shown) and its electrical length is one-quarter wavelength of the first IF frequency (920 MHz). A pair of insulated wires is disposed in the tube, the wires being magnetically and capacitively coupled to each other. Input port 18 is connected through a series connection of a resistor 22 and a pin diode D1 to ground. A variable low capacitance trimming capacitor 24 is coupled between input port 18 and ground for enabling full utilization of the AGC range.

Input port 17 and output port 20 are connected by a pair of series connected choke coils 26 and 28, the junction of which is connected to ground through a capacitor 27. Output port 19 is connected to a similar arrangement of a resistor 32 connected in series with a pin diode D2 that is connected to ground. A variable trimming capacitor 34 is connected between output port 19 and ground. In order to be functional, the coupler 16 has matched and balanced terminations. Whatever impedance input port 18 sees is tracked by an identical impedance that is seen by output port 19. Output port 20 is connected to a high pass filter 40, consisting of a pair of series connected capacitors and an inductor, which couples the first IF signal to a first IF amplifier 44. A second mixer 46 receives signals from first IF amplifier 44 and from a second local oscillator 48 and develops a 44 MHz second IF signal which is applied to a second IF amplifier 50. A detector circuit 52 detects the second IF signal and produces a digital output signal and an AGC voltage. The AGC voltage is applied through a resistor 29 to the junction of coils 26 and 28 and through coupler 16 to control the conduction levels of pin diodes D1 and D2.

The input signal power available (PA) from first mixer 12 is controlled so that the signal power to the load (PL), that is the signal applied to first IF amplifier 44, does not overload the IF amplifier. PA is taken between input port 17 and ground. PL is taken between output port 20 and ground. The legend P1 indicates power dissipated in the termination of input port 18 and P2 indicates power dissipated in the termination of output port 19. The AGC circuit of the invention varies the amount of the available power PA that is transferred to the IF amplifier 44, which is PL without any power being reflected back into the input port 17. This is accomplished by coupler 16, the terminations of which are controlled by the AGC voltage that is applied to control the conductivity of pin diodes D1 and D2 via the choke coils 26 and 28.

The pin diodes D1 and D2 are driven conductive equally by the AGC voltage. Referring to FIG. 2, G1 and G2 are the normalized conductances of pin diode D1 and resistor 22 and pin diode D2 and resistor 32, respectively. When conducting the pin diode impedance is added to the impedances of its associated series resistor. The values of the resistors 22 and 32 are selected, in conjunction with the fully conductive impedance of their associated pin diodes, to equal 50 ohms. Thus when the diodes D1 and D2 are fully conductive, the impedance from input port 18 to ground is 50 ohms and the impedance from the output port 19 to ground is 50 ohms. With the quadrature coupler, one-half the input power is absorbed as P1 and one-half is absorbed as P2 and the output or load power PL is substantially equal to 0, which corresponds to the second line of the chart of FIG. 2. When both diodes D1 and D2 are nonconductive (G1 and G2 both equal 0), substantially all of the available power PA is coupled to the load (line 1 of the chart). Hence PL equals 1 and P1 and P2 are both equal to 0. For intermediate normalized values of G1 and G2 representing different conductivity levels of D1 and D2, the portion of the available power PA that is coupled to the load as PL is proportional to the square of the reflection coefficient associated with ports 18 and 19. The actual values of resistors 22 and 32 will of course be dependent upon the characteristics of the pin diode used on all the stray impedances at ports 17 to 20 and on the frequency of the IF signal. In the preferred embodiment, the first IF frequency is 920 MHz. The pin diodes D1 and D2 exhibit 17 ohms impedance when fully conductive. Thus resistors 22 and 32 each are selected to have an impedance of 33 ohms. In conjunction with a pin diode impedance of 17 ohms, the combination presents a 50 ohm impedance to the associated port of the coupler when the pin diodes are fully conductive. As mentioned, it is important that the impedances of the pin diodes track each other so that balance across the coupler 16 is maintained at all AGC signal levels. For the impedance of 50 ohms that is selected, it will also be understood that the output impedance of the first mixer should be 50 ohms. The diodes appear as less than one picofarad capacitors when 0 DC volts is applied across them. Also, as mentioned, capacitors 24 and 34 enable the full AGC voltage range to be exploited.

It is recognized that numerous modifications in the embodiment of the invention will be apparent to those skilled in the art without departing from its true spirit and scope. The invention is to be limited only as defined in the claims.

What is claimed is:

1. A digital television signal tuner comprising:
    an RF amplifier and a local oscillator;
    mixer means developing a fixed frequency signal from signals from said RF amplifier and said local oscillator;
    a fixed frequency amplifier coupled to said mixer means;
    detector means coupled to said fixed frequency amplifier for detecting the level of said fixed frequency signal; and
    AGC means coupled to said fixed frequency amplifier and responsive to said detector means for controlling the level of said fixed frequency signal while maintaining an impedance match between said mixer means and said fixed frequency amplifier, said AGC means comprising a quadrature coupler having a pair of input ports and a pair of output ports, one of said input ports and one of said output ports being terminated with a series connected resistor and pin diode combination, said AGC means applying a control DC voltage to both said pin diodes for simultaneously controlling their conductivity.

2. The tuner of claim 1 wherein each of said combinations present a 50 ohm impedance when its associated pin diode is fully conductive.

3. The tuner of claim 2, further including a small trimmer capacitance coupled across each of said combinations.

4. The tuner of claim 3 wherein said quadrature coupler comprises a quarter wavelength metal tube having a pair of inductively and capacitively coupled insulated wires therein.

5. A double conversion digital television signal tuner comprising:
    an RF amplifier;
    a first local oscillator;
    a first mixer for developing a first IF signal from signals from said amplifier and said first local oscillator;
    a first IF amplifier for amplifying said first IF signal;
    a second local oscillator;
    a second mixer for developing a second IF signal from a signal from said second local oscillator and said first IF amplifier;
    detector means for detecting said second IF signal and for developing an AGC voltage; and
    coupler means comprising a quadrature coupler having an input port and an output port, each terminated by a series connected resistor and pin diode combination, for controlling the level of said first IF signal applied to said first IF amplifier in response to said AGC voltage while maintaining an impedance match between said first mixer and said first IF amplifier.

6. The tuner of claim 5 wherein each of said combinations presents a 50 ohm terminating impedance when its associated pin diode is fully conductive.

7. The tuner of claim 6, further including a small trimmer capacitance coupled across each of said combinations.

8. The tuner of claim 7 wherein said quadrature coupler comprises a quarter wavelength metal tube having a pair of inductively and capacitively coupled insulated wires therein.

* * * * *